United States Patent
Kim et al.

(10) Patent No.: US 7,009,716 B2
(45) Date of Patent: Mar. 7, 2006

(54) SYSTEM FOR MONITORING OPTICAL OUTPUT/WAVELENGTH

(75) Inventors: Jong-Deog Kim, Daejon (KR);
Byung-Seok Choi, Daejon (KR);
Jong-Hyun Lee, Daejon (KR);
Hogyeong Yun, Jeollabuk-Do (KR);
Kwang-Seong Choi, Seoul (KR);
Jong-Tae Moon, Jeollabuk-Do (KR)

(73) Assignee: Electronics and Telecommunications Research Institute, (KR)

( * ) Notice: Subject to any disclaimer, the term of this patent is extended or adjusted under 35 U.S.C. 154(b) by 0 days.

(21) Appl. No.: 10/802,095

(22) Filed: Mar. 15, 2004

(65) Prior Publication Data
US 2005/0046868 A1 Mar. 3, 2005

(30) Foreign Application Priority Data
Aug. 26, 2003 (KR) ................ 10-2003-0059026

(51) Int. Cl.
G01B 9/02 (2006.01)
H01S 3/04 (2006.01)

(52) U.S. Cl. ........................... 356/519; 372/34
(58) Field of Classification Search ............... 356/477, 356/480, 454, 506, 519; 372/32, 34
See application file for complete search history.

(56) References Cited

U.S. PATENT DOCUMENTS

| | | | |
|---|---|---|---|
| 6,272,157 B1 | 8/2001 | Broutin et al. | |
| 6,650,667 B1 * | 11/2003 | Nasu et al. | 372/34 |
| 6,724,789 B1 * | 4/2004 | Vujkovic-Cvijin | 372/32 |
| 6,724,797 B1 * | 4/2004 | Daiber | 372/92 |
| 2002/0071458 A1 * | 6/2002 | Iwafuji | 372/34 |
| 2003/0020981 A1 * | 1/2003 | Vujkovic-Cvijin | 359/124 |
| 2003/0072336 A1 * | 4/2003 | Senapati et al. | 372/32 |
| 2003/0095736 A1 * | 5/2003 | Kish et al. | 385/14 |

FOREIGN PATENT DOCUMENTS

| | | |
|---|---|---|
| JP | 2003-218446 | 7/2003 |
| KR | 1020010011932 | 2/2001 |

(Continued)

OTHER PUBLICATIONS

A Multi-wavelenght Locker for WDM System, 3 pages.
50 GHz Spacing, multi-wavelength tunable locker integrated in a transmitter module with a monolithic-modulator and a DFB-laser, 3 pages.

*Primary Examiner*—Gregory J. Toatley, Jr.
*Assistant Examiner*—Patrick J. Connolly
(74) *Attorney, Agent, or Firm*—Blakely Sokoloff Taylor & Zafman (57) ABSTRACT

A system for monitoring an optical output/wavelength is employed to be used for a WDM system having a narrow channel space by structuring an etalon and photodiode as an integrated structure. The system includes: a laser source control unit for controlling the laser source; an optical/wavelength monitoring unit for monitoring an optical output/wavelength of the controlled laser source; a TEC control unit for controlling a TEC in order to constantly maintain the laser source of the optical output/wavelength monitoring unit to have a predetermined temperature; a temperature control unit for controlling a heater and a thermistor to set an etalon to a predetermined temperature, wherein the heater is attached on the optical output/wavelength monitoring unit and the thermistor is attached on the heater; a comparison unit for comparing the optical output signal and the wavelength signal, each of which is monitored by the optical output/wavelength monitoring unit; and a processing unit for comparing values of the compared signals with a preset value to control an input current or a temperature of the laser source.

18 Claims, 5 Drawing Sheets

FOREIGN PATENT DOCUMENTS

| KR | 1020010027330 | 4/2001 |
| KR | 1020020019855 A | 3/2002 |

* cited by examiner

SYSTEM FOR MONITORING OPTICAL OUTPUT/WAVELENGTH

FIELD OF THE INVENTION

The present invention relates to an optical communication system device; and, more particularly, to a system for monitoring an optical output/wavelength of a laser source in a wavelength division multiplexing (WDM) system.

DESCRIPTION OF THE PRIOR ART

In an optical communication system, there is a demand to reduce a cost for a unit data transmission in order to spread an optical communication network over a unit subscriber. To meet the demand fundamentally, there has been introduced a high-speed transmission system or a multi-channel transmission system, for maximizing a transmission capacity through a single optical fiber.

However, in the multi-channel transmission system, since there is a limitation of a bandwidth that an exemplary optical fiber enables to receive various channels, a reduction of a channel space is an easy solution in order to broaden the transmission capacity. For instance, a multi-channel technique has been developed to reduce the channel space from 200 GHZ to 100 GHZ, and further to 50 GHz. Furthermore, researches for a next generation multi-channel transmission system have been conducted to reduce the channel space to 25 GHz and so far as to 12.5 GHz.

Meanwhile, as the channel space is narrower and narrower, it is more important to minimize a signal noise between channels. That is, it is required to control a signal wavelength for each channel accurately and reliably to minimize the signal noise. However, even if a distributed feedback laser diode (DFB LD) is used for overcoming the above problem, i.e., the signal noise, the DFB LD has still the limitation to be applicable for the multi-channel transmission system having the channel space of less than 100 GHZ.

In order to address the above problem and to secure a reliability of the wavelength for all the light sources, there has been developed a wavelength stabilizing technique. Furthermore, in a dense wavelength division multiplexing (DWDM) system, it is important to control the wavelength flexibly for mutually exchanging signals between the channels. To meet the demand, a wide tunable laser is currently utilized in which the wavelength itself is changed flexibly across the broad bandwidth to be fixed to a desired channel. Therefore, the wavelength stabilizing technique becomes an essential one in a tunable laser module. In addition, the wavelength stabilizing technique for monitoring the broad wavelength band having shot channel space is required lately.

The conventional wavelength stabilizing technique is mainly used for the single wavelength. But, in order to apply the multi-wavelength stabilizing technique for the multi-channels, it is effective to utilize a technique employing a periodic transmission spectrum characteristic of an etalon up to date. Generally, a beam splitter is additionally used in the technique employing the etalon, in order to divide a laser beam into two portion of which one is used for monitoring an optical output and the other is used for monitoring the wavelength. As a result, it is too large for a wavelength stabilizer to be integrated in a single optical module together with the beam splitter. Moreover, in case of fabricating the wavelength stabilizer separated from the laser source, it is very important whether it is dependent upon a polarization characteristic from the optical fiber or not. Furthermore, in order to align the transmission spectrum of the etalon near to a target channel and concurrently to monitor the broad bandwidth, it is indispensable to align accurately the etalon with respect to an incident light. After all, it is necessary to align a photodiode while monitoring photocurrent.

Figure 1:
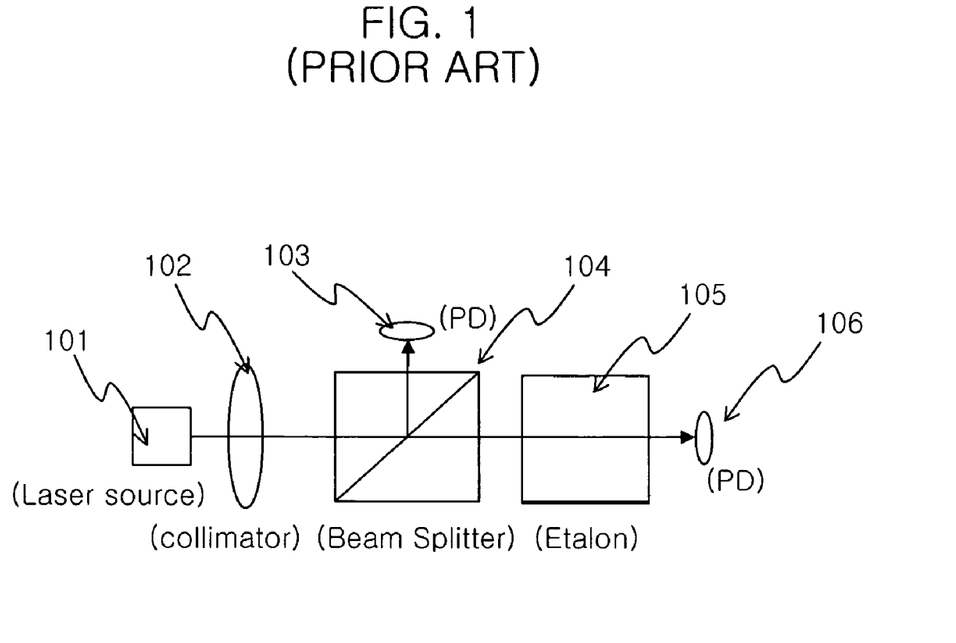
FIG. 1 is a schematic view setting forth a conventional apparatus for monitoring an optical output/wavelength for use in a wavelength division multiplexing (WDM) transmission system.

Referring to FIG. 1, there is shown a schematic view setting forth a conventional apparatus for monitoring optical output/wavelength.

In FIG. 1, the apparatus for monitoring the optical output/wavelength includes a laser source 101, a collimator 102 for adjusting a divergence angle of a laser beam generated at the laser source 101, a beam splitter 104 for splitting the laser beam collimated through the collimator 102, a first photodiode 103 for monitoring an output intensity of the laser beam outputted from the collimator 102, an etalon 150 for filtering the laser beam transmitted through the beam splitter 104, and a second photodiode 106 for monitoring the wavelength outputted from the etalon 404.

In the conventional apparatus for monitoring the optical output/wavelength, however, as the channel space is reduced, the etalon 105 becomes lengthened. What is more, the use of the beam splitter 104 makes the apparatus for monitoring the optical output/wavelength to be hardly integrated within a small area of an optical device.

Besides, the conventional apparatus for monitoring the optical output/wavelength suffers from another shortcoming that it is difficult to utilize the optical output effectively in case of a passive optical alignment. On the contrary, in case of an active optical alignment while monitoring the signal, there is a disadvantage that there are required lots of times to assemble optical parts. Especially, in order to obtain the transmission spectrum of the etalon 105 having the channel space which is demanded for the WDM system, it is necessary to assemble the etalon 105 with respect to an optical axis of the laser source 101. But, whole the optical parts are individually assembled and aligned in the prior art, whereby it is difficult to achieve the desired spectrum of the etalon 105 in the long run.

SUMMARY OF THE INVENTION

It is, therefore, an object of the present invention to provide a system for monitoring an optical output/wavelength for use in a wavelength division multiplexing (WDM) transmission system by fabricating an etalon and photodiodes as an integrated structure.

In accordance with one aspect of the present invention, there is provided a system for monitoring an optical output/wavelength of a laser source, including: a laser source control unit for controlling the laser source; an optical/wavelength monitoring unit for monitoring an optical output/wavelength of the controlled laser source; a TEC control unit for controlling a thermo electric cooler (TEC) in order to constantly maintain the laser source of the optical output/wavelength monitoring unit to have a specific temperature; a temperature control unit for controlling a heater and a thermistor to set an etalon to a specific temperature, wherein the heater is attached on the optical output/wavelength monitoring unit and the thermistor is attached on the heater; a comparison unit for comparing the optical output signal and the wavelength signal, each of which is monitored by the optical output/wavelength monitoring unit; and a processing unit for comparing values of the compared signals with a preset value to control an input current or a temperature of the laser source.

In accordance with another aspect of the present invention, there is provided an apparatus for monitoring an optical output/wavelength, including: a laser source for generating a laser beam according to a control signal outputted from a laser source control unit; a collimation unit for adjusting a divergence angle of the laser beam outputted from the laser source; an optical output monitoring unit for sensing an intensity of the laser beam outputted from the collimation unit; a filtering unit for filtering the laser beam outputted from the collimation unit; an optical wavelength monitoring unit for sensing the wavelength generated from the filtering unit; a first mounting unit for mounting the optical output monitoring unit; a second mounting unit for mounting the optical wavelength monitoring unit; an alignment unit for aligning the optical output monitoring unit, the filtering unit, the optical wavelength monitoring unit, the first mounting unit and the second monitoring unit and for minimizing a heat conducted from a heater to the optical output monitoring unit, the filtering unit, the optical wavelength monitoring unit, the first mounting unit and the second mounting unit in sequence, the alignment unit having a metal pattern to process an electric signal; a heating unit for changing a temperature of the filtering unit; and a temperature sensing unit for sensing a temperature of the heating unit, to thereby control the temperature of the filtering unit.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 2A:
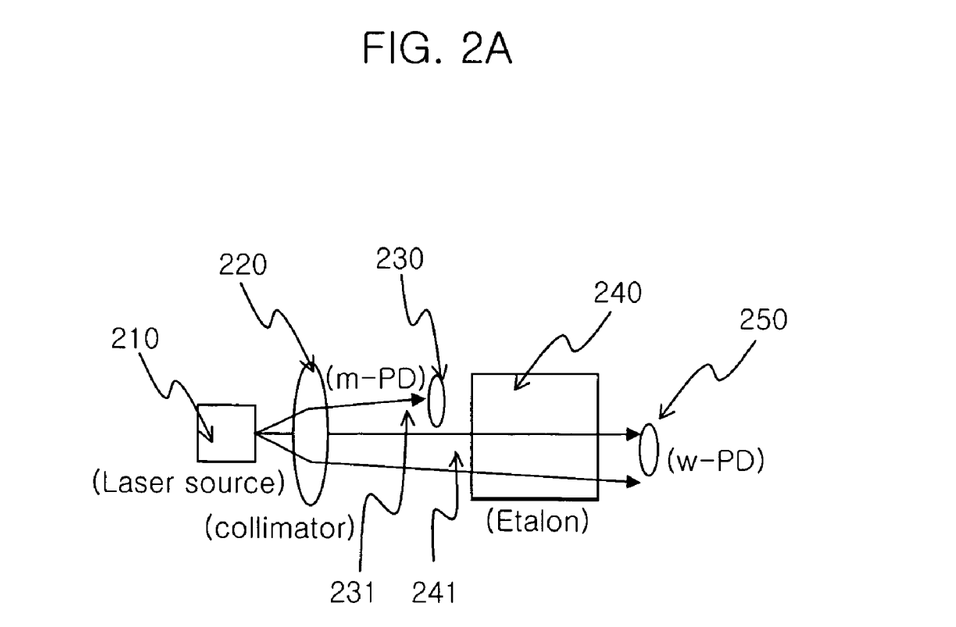
FIGS. 2A to 2C are schematic views setting forth an apparatus for monitoring an optical output/wavelength in accordance with a first preferred embodiment of the present invention.
Figure 2B:
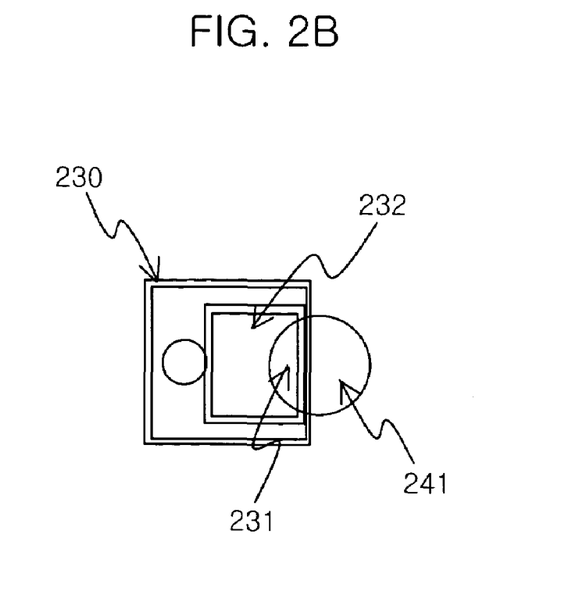
Figure 2C:
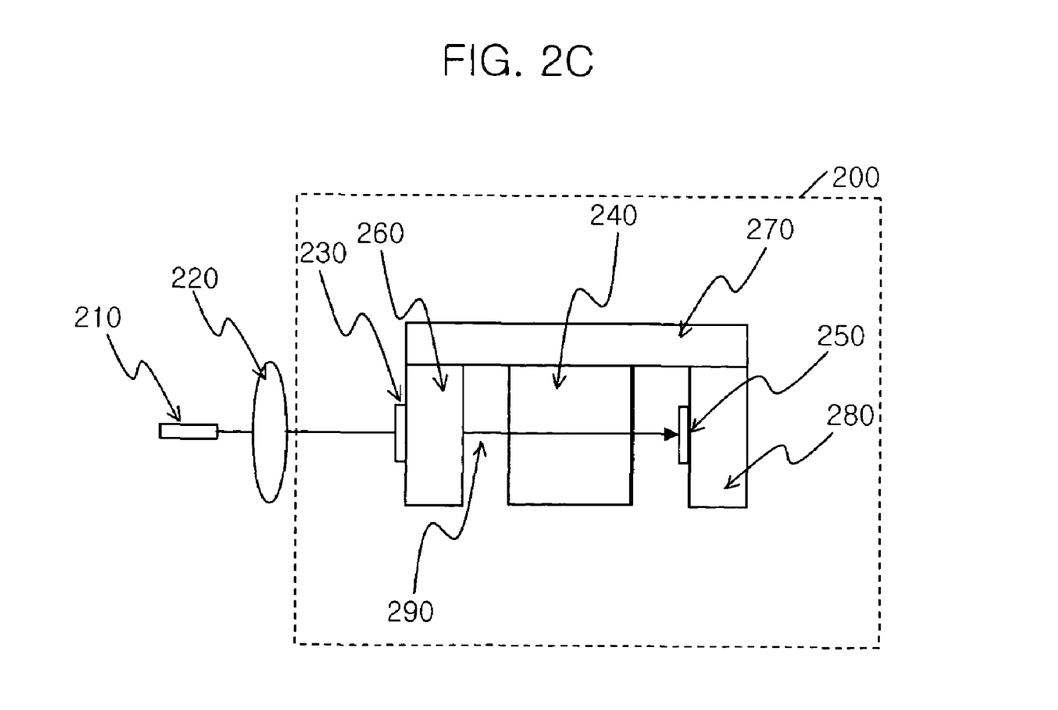

Referring to FIGS. 2A to 2C, there are shown schematic views setting forth an apparatus for monitoring an optical output/wavelength monitor for use in a wavelength division multiplexing (WDM) transmission system in accordance with a first preferred embodiment of the present invention.

In FIG. 2A, the apparatus for monitoring the optical output/wavelength includes a laser source 210 for generating a laser beam, a collimator 220 for adjusting a divergence angle of the laser beam, a first photodiode 230 for monitoring an output intensity of the laser beam transmitted through the collimator 220, an etalon 240 for filtering the laser beam outputted from the collimator 220 and a second photodiode 250 for monitoring a wavelength of the laser beam outputted from the etalon 240.

The first photodiode is disposed at a predetermined location so that a portion 231 of a collimated laser beam passing through the collimator 220 is used for monitoring the output intensity of the laser beam. On the other hand, the other portions of the collimated laser beam, not shielded by the first photodiode 230, are transmitted through the etalon 240 and are inputted into the second photodiode 250, to thereby monitor the wavelength of an outputted signal. Herein, it is noted that the shielded portion by the first photodiode 230 is substantially less than 50% with respect to the total laser beam. Therefore, it is not required a supplementary apparatus for splitting the laser beam in the present invention so that it is possible to miniaturize an optical module.

Referring to FIG. 2B, there is shown a schematic view setting forth the first photodiode 230 depicted in FIG. 2A in accordance with the present invention.

In FIG. 2B, the first photodiode 230 for monitoring the output intensity has a light-receiving part 232 therein. In detail, the light-receiving part 232 plays a role in receiving the laser beam and converting a received laser beam into a photocurrent, wherein the light receiving part 232 is aligned to receive predetermined portions of the incident laser beam with a circular or an ellipsoidal cross section. In particular, it is preferable that the light-receiving part 232 having a rectangular shape should be disposed at a location within 100 $\mu$m from one side of the first photodiode 230. Alternatively, the light-receiving part 232 can be fabricated in a hemi-circular or a hemi-ellipsoidal shape. In this case, one side of the light-receiving part 232 should be also disposed nearby one side of the first photodiode 230.

However, since there are lots of times and endeavors to separately align the first photodiode 230, the etalon 250 and the second photodiode 260, it is necessary to fabricate an integrated structure provided with the etalon 250 and photodiode blocks, which will be described in detail in FIG. 2C.

Referring to FIG. 2C, there is shown a schematic view setting forth the apparatus 200 for monitoring the optical output/wavelength monitor having the integrated structure of the etalon and the photodiodes therein in accordance with the first preferred embodiment of the present invention.

In FIG. 2C, the apparatus 200 for monitoring the optical output/wavelength includes the laser source 210, the collimator 220 for adjusting a divergence angle of a laser beam generated at the laser source 210, the first photodiode 230 for monitoring an output intensity of the laser beam outputted from the collimator 220, the etalon 240 for filtering the laser beam outputted from the collimator 220, the second photodiode 250 for monitoring the wavelength outputted from the etalon 240, a first metal-patterned ceramic mount 260 where the first photodiode 230 is attached, a second metal-patterned ceramic mount 280 where the second photodiode 250 is attached and a flat 270 for minimizing a heat conducted from a heater (not shown) to a plurality of parts. Herein, the flat 270 has two patterns on both surfaces of which one is used for aligning the plurality of parts in the apparatus 200 for monitoring the optical output/wavelength and the other is used for processing an electric signal. In detail, the flat 270 has electrodes for the first photodiode 230 and the second photodiode 250, wherein the electrodes are interconnected through the pattern, which is not shown in the drawing for the sake of convenience. That is, in the present invention, since there is employed a conductive holder for the flat 270 to monitor photo-current from the first and the second photodiodes 230, 250, each optical part is optically aligned as an integrated structure in the apparatus 200 for monitoring the optical output/wavelength.

Meanwhile, the first and the second metal-patterned ceramic mounts 260, 280 have same heights as that of the etalon 240 in FIG. 2C. The apparatus 200 for monitoring the optical output/wavelength is disposed on a thermo-electric cooler (TEC) with the laser source which will be more illustrated in FIG. 3. Herein, the laser beam outputted from the collimator 220 can be divided by the beam splitter, if necessary, so that a predetermined portion of the laser beam is used for monitoring the optical output/wavelength and the other portion is used for an optical transmission signal.

Figure 3:
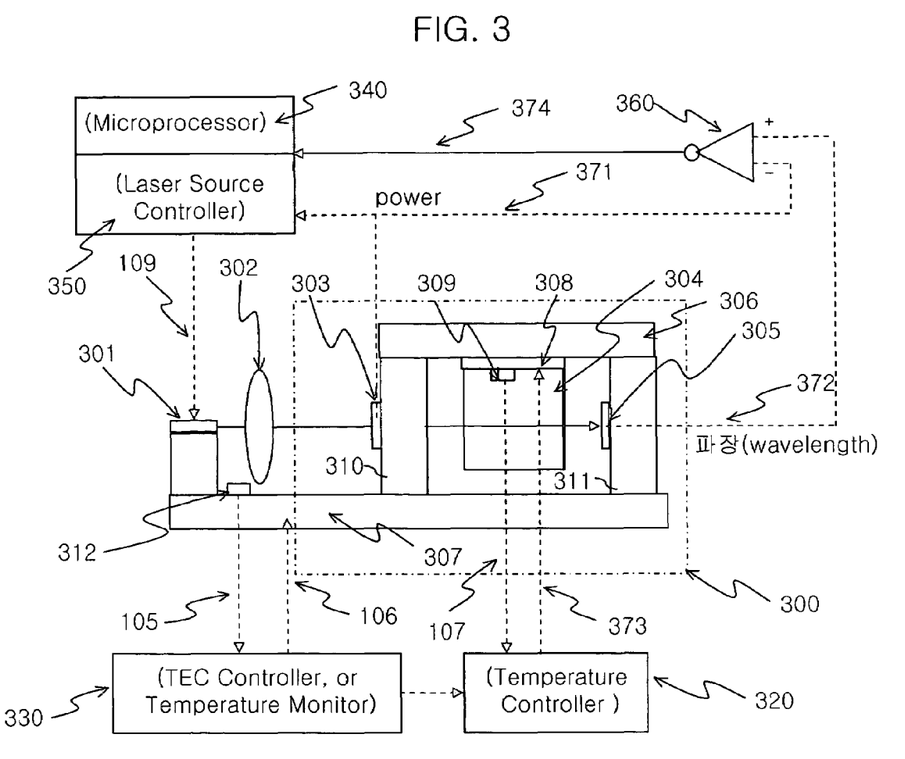
FIG. 3 is a schematic view setting forth a system for monitoring an optical output/wavelength in accordance with the present invention.

Referring to FIG. 3, there is shown a system for monitoring an optical output/wavelength in accordance with the present invention.

In FIG. 3, the system for monitoring the optical output/wavelength includes a laser source controller 350 for controlling a laser source 301, an optical output/wavelength monitor 300 for monitoring an optical output/wavelength of the laser source outputted from the laser source controller 350, a TEC controller/temperature monitor 330, a temperature controller 320, a comparator 360 for comparing the optical output signal with a wavelength signal which are monitored at the optical output/wavelength monitor 330 and a microprocessor 340. Herein, the TEC controller/temperature monitor 330 plays a role in controlling the TEC in case of keeping a temperature of the laser source to be constant. Alternatively, if it is not necessary to control the temperature of the laser source, the TEC controller/temperature monitor 330 serves only as a temperature monitor for monitoring an exterior temperature of the optical output/wavelength monitor 300.

Furthermore, a heater 308 and a first thermistor 309 attached on the heater 308 are controlled by the temperature controller 320 so that the etalon has a constant temperature. The microprocessor 340 plays a role in comparing the signal compared at the comparator 360 with a preset value and controlling an input current or a temperature of the laser source 301.

In detail, the optical output/wavelength monitor 350 includes the laser source 301, a collimator 302 for adjusting a divergence angle of a laser beam generated at the laser source 301, a first photodiode 303 for monitoring an output intensity of the laser beam outputted from the collimator 302, an etalon 304 for filtering the laser beam outputted from the collimator 302, a second photodiode 305 for monitoring the wavelength outputted from the etalon 304, a first metal-patterned ceramic mount 310 where the first photodiode 303 is attached, a second metal-patterned ceramic mount 311 where the second photodiode 305 is attached, a thin film heater 308 for varying the temperature of the etalon 304, a flat 306 for minimizing a heat conducted from the thin film heater 308 to a plurality of parts from a heater, the first thermistor 309 for sensing the temperature of the thin film heater 308, a ceramic substrate 307 for aligning the optical output/wavelength monitor 300 together with the laser source 301 and a second thermistor 312 for sensing the temperature of the ceramic substrate 307. Herein, the flat 306 has two patterns on both surfaces of which one is used for aligning the plurality of parts in the optical output/wavelength monitor 300 and the other is used for processing an electric signal.

Meanwhile, since the first and the second metal-patterned ceramic mounts 310, 311 are relatively longer than the etalon 304 in comparison with the first embodiment, there is a space, i.e., an air-filled layer, between the etalon 304 and the ceramic substrate 307 so that the etalon 304 is thermally isolated from the ceramic substrate 307. In addition, the optical output/wavelength monitor 300 has a bridge-shaped structure to thereby minimize the heat conducted from the heater 308 to the ceramic substrate 307 and to minimize a power consumption of the heater 308.

The optical output/wavelength monitor 300 having the integrated structure uses a total laser beam collimated by means of the collimator 302 for monitoring the optical output/wavelength. Alternatively, the laser beam outputted from the collimator 302 is divided into two portions thereof by virtue of a supplementary beam splitter so that a divided one portion is used for the optical output/wavelength monitor 300 and the other is used for the optical transmission. At this time, the optical output/wavelength monitor 300 is disposed in a rear of the divided one portion of the laser beam for monitoring.

A mechanism of the system for monitoring the optical output/wavelength of the present invention is more illustrated as followings.

To begin with, in case the second thermistor 312 is assembled on the ceramic substrate 307 with the laser source 301 and the wavelength stabilizer 300, the second thermistor 312 and the TEC controller 330 for controlling the TEC make the laser source 301 and the ceramic substrate 307 have a constant temperature.

In the optical output/wavelength monitor 300 which is attached on the ceramic substrate 307, the heater 308 and the first thermistor 309 are connected to the temperature controller 320. The temperature controller 320 controls a power 373 applied to the heater 308 in order that the transmission characteristic of the etalon 304 may be fixed to a predetermined temperature range to monitor an ITU-channel wavelength for the wavelength division multiplexing (WDM) system. As a result, the present invention provides a calibration method for calibrating a transmission characteristic error of the etalon 304, which is incurred by alignment mismatch between the laser source 301 and the etalon 304 during an optical alignment or an assembly of the module. Therefore, it is possible to monitor wavelength for a plurality of channels.

Meanwhile, the optical output signal 371 monitored at the first photodiode 303 and the wavelength signal 372 monitored at the second photodiode 305 are compared each other at the comparator 360, to thereby output a compared signal 372. The compared signal 372 is inputted into the microprocessor 340 and is compared with a preset value. Herein, if there is any variation between the compared signal 372 and the preset value, the input current or the temperature of a light source is adjusted by the laser source controller 350 so that the light source has a uniform wavelength. At this time, the light source may be the laser source 301 which is integrated in a single module or may be an exterior light source out of the module in which the incident light is transmitted into the module by means of an optical fiber. Alternatively, it is possible to keep the wavelength to be uniform by controlling the temperature of the light source by virtue of the TEC controller 330.

The optical output/wavelength monitor 300 for use in the optical output/wavelength system can be substituted for the other ones having different structures which will be described in FIGS. 4 and 5. Moreover, while the ceramic substrate 307 is disposed on the TEC in the drawing, it can be supposed to be a package substrate exposed to an external temperature variation. In this case, the TEC controller 330 becomes only the temperature monitor for monitoring the temperature of the ceramic substrate 307 by means of the second thermistor 312. Concurrently, the above temperature monitor can be used for controlling the temperature controller 320 to calibrate a minute temperature difference of the etalon 304 in virtue of the microprocessor 340.

Figure 4:
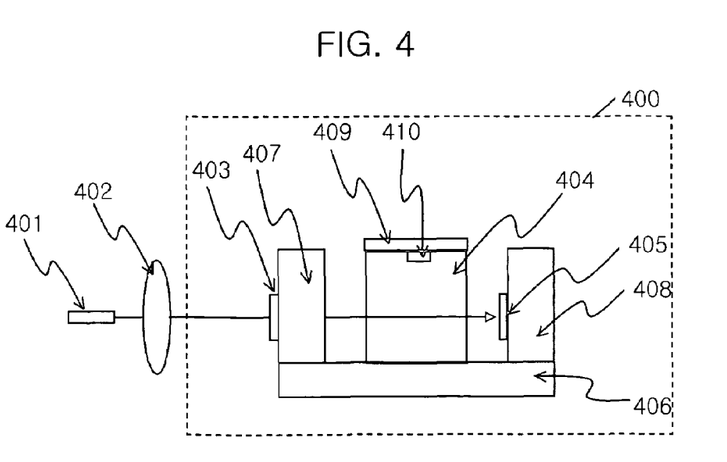
FIG. 4 is a schematic view setting forth an apparatus for monitoring an optical output/wavelength in accordance with a second preferred embodiment of the present invention.

Referring to FIG. 4, there is shown a schematic view setting forth an apparatus 400 for monitoring an optical output/wavelength in accordance with a second preferred embodiment of the present invention. In the second embodiment, the optical output/wavelength monitor is disposed on the TEC together with the laser source.

In FIG. 4, the apparatus 400 for monitoring the optical output/wavelength includes a laser source 401, a collimator 402 for adjusting a divergence angle of a laser beam generated at the laser source 401, a first photodiode 403 for monitoring an output intensity of the laser beam outputted from the collimator 402, an etalon 404 for filtering the laser beam outputted from the collimator 402, a second photodiode 405 for monitoring the wavelength outputted from the etalon 404, a first metal-patterned ceramic mount 407 where the first photodiode 403 is attached, a second metal-patterned ceramic mount 408 where the second photodiode 405 is attached, a thin film heater 409 for varying the temperature of the etalon 404, a thermistor 410 for sensing the temperature of the thin film heater 408, a ceramic substrate 406 for aligning the apparatus 400 for monitoring the optical output/wavelength with the laser source 401.

In the second embodiment, the first and the second photodiode 403, 405, the first and the second metal-patterned ceramic mount 407, 408 and the etalon 404 are wholly formed on the ceramic substrate 406 as an integrated structure. The thin film heater 409 and the thermistor 410 are disposed on the etalon 404 for controlling the temperature of the etalon 404. That is, the temperature of the etalon 404 is dependent upon the temperature of the TEC so that the transmission characteristic of the etalon 404 is determined by means of the temperature difference between an upper portion of the etalon 404 and a lower portion thereof and the temperature of a central portion thereof.

Meanwhile, the apparatus 400 for monitoring the optical output/wavelength having the integrated structure uses a total laser beam collimated by means of the collimator 402 for monitoring the optical output/wavelength. Alternatively, the laser beam outputted from the collimator 402 is divided into two portions thereof by virtue of the beam splitter so that a divided one portion is used for the optical output/wavelength monitor 400 and the other is used for the optical transmission. At this time, the apparatus 400 for monitoring the optical output/wavelength is disposed in a rear of the divided one portion of the laser beam for monitoring.

Figure 5A:
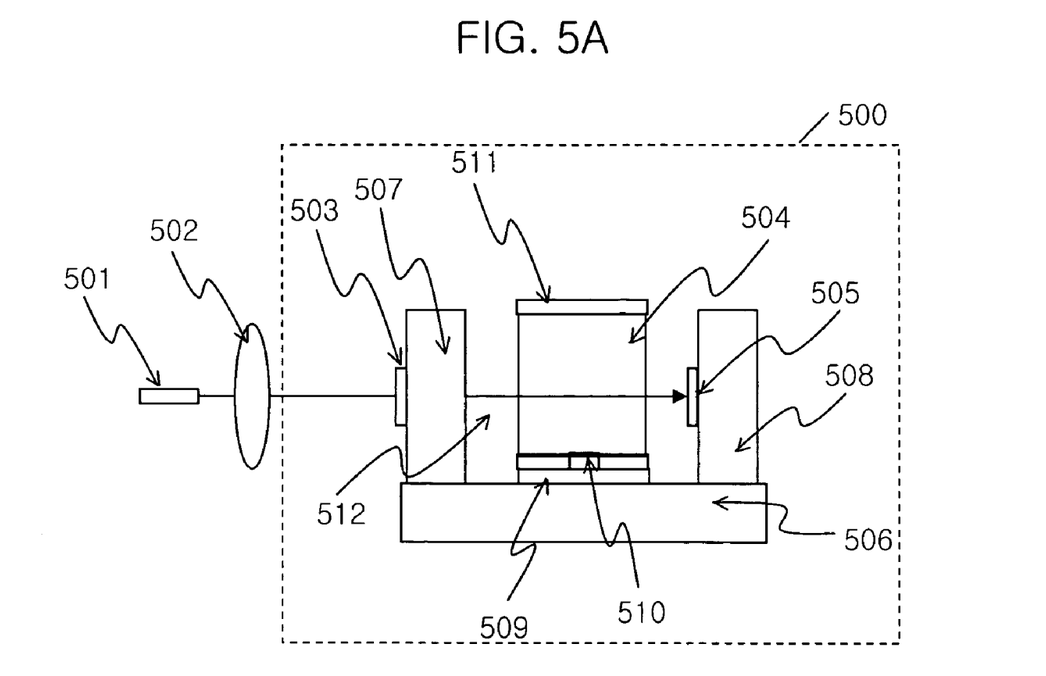
FIGS. 5A and 5B are schematic views setting forth an apparatus for monitoring an optical output/wavelength and a C-shaped structure in accordance with a second preferred embodiment of the present invention.
Figure 5B:
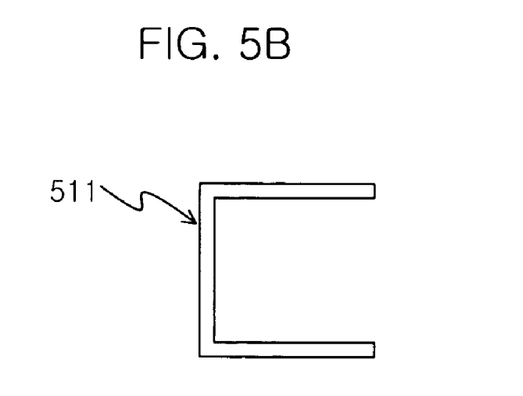

Referring to FIGS. 5A and 5B, there are shown schematic views setting forth an apparatus 500 for monitoring an optical output/wavelength monitor in accordance with a third preferred embodiment of the present invention. The inventive apparatus 500 can be used for an interior of the system for monitoring the optical output/wavelength and simultaneously can be used as an exterior part separated from the system.

In FIG. 5A, the apparatus 500 for monitoring the optical output/wavelength includes a laser source 501, a collimator 502 for adjusting a divergence angle of a laser beam generated at the laser source 501, a first photodiode 503 for monitoring an output intensity of the laser beam outputted from the collimator 502, an etalon 504 for filtering the laser beam outputted from the collimator 502, a second photodiode 505 for monitoring the wavelength outputted from the etalon 504, a first metal-patterned ceramic mount 507 where the first photodiode 503 is attached, a second metal-patterned ceramic mount 508 where the second photodiode 505 is attached, a thin film heater 509 for varying the temperature of the etalon 504, a first thermistor 510 for sensing the temperature of the thin film heater 509, a ceramic substrate 506 for aligning the apparatus 500 for monitoring the optical output/wavelength together with the laser source 501 and a C typed metal block for heat conduction over the whole etalon 504.

The more detail description for the C typed metal block is illustrated as referred to FIG. 5B. In FIG. 5B, the etalon 504 is assembled with the C typed metal block such a shape that embraces the etalon 504. Between the etalon 504 and the ceramic substrate 506, there is the thin film heater 509. Herein, the ceramic substrate 506 is fabricated using a predetermined material which can minimize heat conduction. Accordingly, the temperature of the etalon 504 is independent on a condition of the exterior temperature.

Meanwhile, the apparatus 500 for monitoring the optical output/wavelength having the integrated structure uses a total laser beam collimated by means of the collimator 502 for monitoring the optical output/wavelength. Alternatively, the laser beam outputted from the collimator 502 is divided into two portions thereof by virtue of the beam splitter so that a divided one portion is used for monitoring the optical output/wavelength and the other is used for the optical transmission. At this time, the optical output/wavelength monitor 500 is disposed in a rear of the divided one portion of the laser beam for monitoring.

Figure 6:
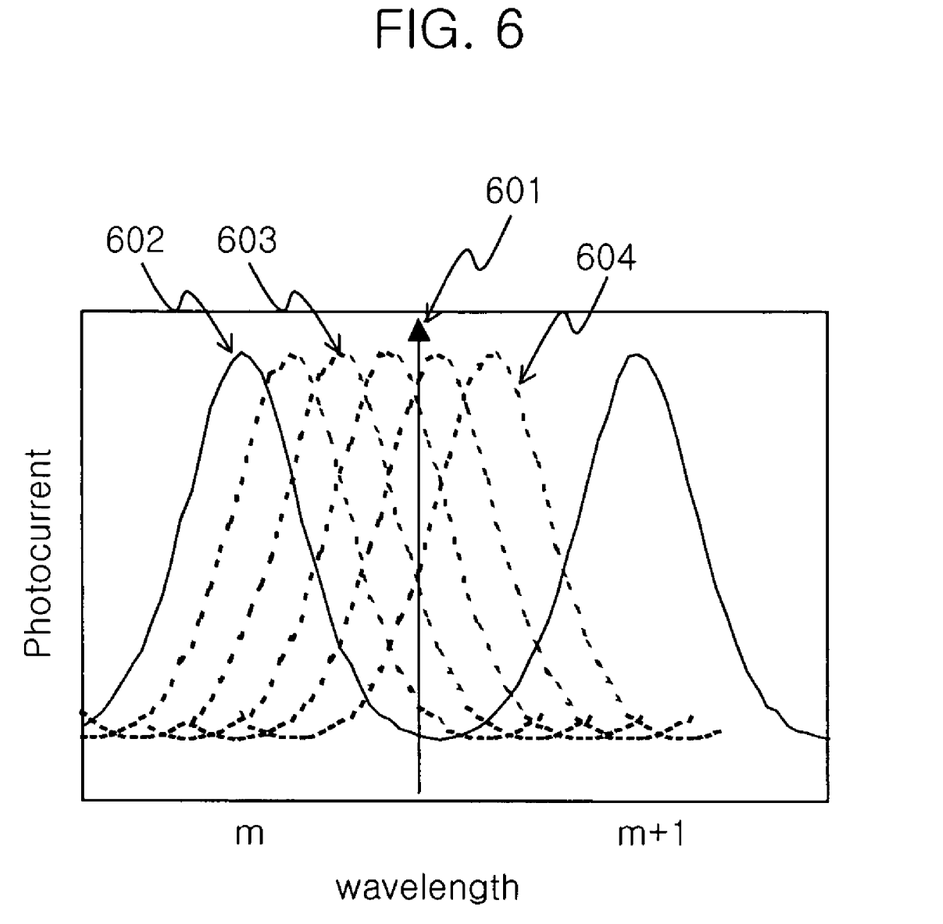
FIG. 6 is graphs setting forth a spectrum characteristic of the optical output/wavelength monitoring system in accordance with the present invention.

Referring to FIG. 6, there are shown graphs setting forth a spectrum characteristic of the optical output/wavelength monitoring system in accordance with the present invention.

In FIG. 6, denotations of 601, 602 represent a target WDM wavelength channel and a wavelength-monitored spectrum, respectively. Furthermore, denotations of 603 and 604 represent a first and a second calibration spectrum with respect to the target WDM wavelength 601.

In general, in order to stabilize the wavelength across a broad bandwidth, the target wavelength is disposed in a central portion between a left slope and a right slope of the transmission spectrum of the etalon. However, in a calibration process by means of the temperature controller, the left slope or the right slope of the transmission spectrum is selectively utilized, to thereby minimize the temperature variation. That is, in case of coinciding the left slope of the wavelength monitoring spectrum 602 with the target spectrum 601, it is necessary to make use of the second calibration spectrum 604. On the contrary, in case of coinciding the right slope of the wavelength monitoring spectrum 602 with the target spectrum 601, the first calibration spectrum 603 utilized for calibration so that it is possible to control the wavelength despite small change of the temperature. This is an effective method for reducing the power consumption by minimizing a temperature change when the apparatus for monitoring the optical output/wavelength is integrated into a temperature control device together with the laser source.

As described above, the inventive system for monitoring the optical output/wavelength provides an advantage that it is possible to miniaturize the system device without a supplementary use of a grating prism or a beam splitter because the first photodiode enables to split the laser beam and simultaneously monitors the optical output.

Additionally, since the first and the second photodiodes and etalon are assembled as the integrated structure by means of the metal-patterned ceramic mounts, a minute optical alignment can be achieved with ease.

Furthermore, it is possible to calibrate the minute error during the optical alignment by controlling the temperature of the etalon in virtue of the thin film heater and the thermistor. In this case, the apparatus for monitoring the optical output/wavelength is structured to minimize the power consumption of the thin film heater, as aforementioned.

Moreover, the inventive apparatus for monitoring the optical output/wavelength can be integrated in one optical module with the light source device and alternatively it can be fabricated separately from the optical module.

While the present invention has been described with respect to the particular embodiments, it will be apparent to those skilled in the art that various changes and modifications may be made without departing from the scope of the invention as defined in the following claims.

What is claimed is:

1. A system for monitoring an optical output/wavelength of a light beam emitted from a laser source, comprising:
   a laser source control means for controlling the laser source, wherein the light beam travels along a propagation path with a divergence angle with respect to an optical axis;
   an optical output monitoring unit located within the divergence angle of the light beam for receiving a portion of the light beam and for sensing an intensity of the light beam at a predetermined location for receiving predetermined portions of the light beam, thereby obtaining an optical output signal;
   a filtering unit for filtering the light beam;
   an optical wavelength monitoring unit located within the divergence angle of the light beam for receiving the other portion of the light beam not shielded by the optical output monitoring unit and for sensing the wavelength generated from the filtering unit, thereby obtaining a wavelength signal;
   a thermo-electric cooler (TEC) control means for controlling a TEC in order to constantly maintain the laser source to have a predetermined temperature;
   a temperature control means for controlling a heater and a thermistor to set an etalon to a predetermined temperature independently on the maintained temperature of laser source by the TEC, wherein the heater is attached on the filtering unit on the air gap space on the TEC and the thermistor is attached on the heater;
   a comparison means for comparing the optical output signal and the wavelength signal; and
   a processing means for comparing values of the compared signals with a preset value to control an input current or a temperature of the laser source.

2. The system as recited in claim 1, further comprising a temperature monitoring means for sensing an external temperature of the filtering unit in case it is unnecessary to control the temperature of the laser source.

3. The system as recited in claim 1, wherein the system includes:
   a collimation unit for adjusting the divergence angle of the light beam outputted from the laser source;
   a first mounting unit for mounting the optical output monitoring unit;
   a second mounting unit for mounting the optical wavelength monitoring unit;
   a first alignment unit for aligning the optical output monitoring unit, the filtering unit, the optical wavelength monitoring unit, the first mounting unit and the second mounting unit, and for minimizing a heat conducted from a heater to the optical output monitoring unit, the filtering unit, the optical wavelength monitoring unit, the first mounting unit and the second mounting unit, the first alignment unit having a metal pattern to process an electric signal;
   a heating unit for changing a temperature of the filtering unit;
   a first temperature sensing unit for sensing a temperature of the laser source;
   a second alignment unit for aligning the laser source, the optical output monitoring unit, the filtering unit, the optical wavelength monitoring unit, the first mounting unit and the second mounting unit; and
   a second temperature sensing unit for sensing a temperature of the filtering unit.

4. The system as recited in claim 3, wherein the predetermined location being adjusted in a horizontal direction with respect to the light beam.

5. The system as recited in claim 3, wherein the first alignment unit makes all parts for monitoring the optical output/wavelength be assembled as an integrated structure by using a metal-patterned substrate, and the first alignment unit enables to adjust an optical alignment by moving the integrated structure while monitoring the optical output/wavelength.

6. The system as recited in claim 3, wherein the heating unit is controlled by the temperature control means together with the second temperature sensing unit, thereby maximizing a transmission characteristic of the filtering unit and a wavelength monitoring capability.

7. The system as recited in claim 1, wherein the processing means compares a ratio of the signal monitored at the optical output monitoring unit and the signal monitored at the optical wavelength monitoring unit with the present the input current or the temperature of the laser source, the processing unit having a program to compare a target wavelength channel with a corresponding preset value for monitoring and stabilizing a channel wavelength.

8. An apparatus for monitoring an optical output/wavelength, comprising:
   a laser source for generating a laser beam according to a control signal outputted from a laser source control means;
   a collimation means for adjusting a divergence angle of the laser beam outputted from the laser source;
   an optical output monitoring means located within the divergence angle of the laser beam for receiving a portion of the laser beam and for sensing an intensity of the laser beam outputted from the collimation means at a predetermined location for receiving predetermined portions of the laser beam, thereby obtaining an optical output signal;
   a filtering means for filtering the laser beam outputted from the collimation means;
   an optical wavelength monitoring means located within the divergence angle of the laser beam for receiving the other portion of the laser beam not shielded by the optical output monitoring unit and for sensing the wavelength generated from the filtering means, thereby obtaining a wavelength signal;
   a first mounting means for mounting the optical output monitoring means;
   a second mounting means for mounting the optical wavelength monitoring means;
   an alignment means for aligning the optical output monitoring means, the filtering means, the optical wavelength monitoring means, the first mounting means and the second mounting means and for minimizing a heat conducted from a heater to the optical output monitoring means, the filtering means, the optical wavelength monitoring means, the first mounting means and the second mounting means in sequence, the alignment means having pattern to process an electric signal;

a heating means for changing a temperature of the filtering means and being disposed below a bridge-shaped structure to minimize a path of a heat conduction between the heating means and an exterior; and a temperature sensing means for sensing a temperature of the heating means, to thereby control the temperature of the filtering means.

9. The apparatus as recited in claim 8, wherein the collimation means adjusts the divergence angle and an intensity of the laser source and is aligned at a predetermined position of a laser beam so that the laser beam shielded by the optical output monitoring means is less than a predetermined ratio with respect to the total laser beam.

10. The apparatus as recited in claim 9, wherein the predetermined ratio is substantially less than 50%.

11. The apparatus as recited in claim 8, wherein the alignment means uses a substrate having metal patterns formed on both surfaces thereof, in which one metal pattern is used for assembling parts and the other is used for optically aligning the assembled parts with the laser source while monitoring the signal.

12. The apparatus as recited in claim 8, wherein the heating means is disposed on the filtering means which is formed over the alignment means so that the heat conducted from the heating means to the alignment means is minimized and a height of the filtering means is optimized with respect to an optical axis of the laser source.

13. The apparatus as recited in claim 8, wherein the heating means is assembled on the alignment means and the filtering means is disposed on the heating means and is assembled with a C-shape structure in order for heat to be conducted well.

14. The apparatus as recited in claim 8, wherein filtering means controls a transmission characteristic by virtue of a temperature control so as to maximize a wavelength monitoring capability such that a temperature change at a central portion of the filtering means and a change in a temperature difference of both ends of the filtering means are induced to thereby control a position of an etalon resonance peak of the filtering means and a bandwidth of the peak.

15. The apparatus as recited in claim 8, wherein filtering means controls the transmission characteristic by virtue of the temperature control so as to maximize the wavelength monitoring capability such that a left or a right slope of a transmission spectrum filtered at the filtering means is selected in order to minimize the temperature change.

16. The apparatus as recited in claim 8, wherein filtering means controls a transmission characteristic by virtue of a temperature control so as to maximize a wavelength monitoring capability such that the temperature of the filtering means is set higher than a maximum external temperature for using a wavelength stabilizer in case the wavelength stabilizer is exposed to an external temperature, thereby monitoring the wavelength regardless of the external temperature.

17. The apparatus as recited in claim 8, wherein an air layer is provided under the filtering means to thermally isolate the filtering means from an external object so that the temperature of the filtering means is controlled.

18. The apparatus as recited in claim 8, wherein the laser beam collimated by the collimation means is totally used for monitoring the optical output/wavelength or one portion of the laser beam split by an optical splitter which is disposed in a rear of the collimator means is used for monitoring the optical output/wavelength, the optical splitter splitting the collimated laser beam into said one portion and the other portion in which the said the other portion is used for an optical transmission.

* * * * *